United States Patent
Goodson

(10) Patent No.: US 7,598,654 B2
(45) Date of Patent: Oct. 6, 2009

(54) MEGASONIC PROCESSING APPARATUS WITH FREQUENCY SWEEPING OF THICKNESS MODE TRANSDUCERS

(76) Inventor: J. Michael Goodson, 92 Rolling Hill Rd., Skillman, NJ (US) 08558

( * ) Notice: Subject to any disclaimer, the term of this patent is extended or adjusted under 35 U.S.C. 154(b) by 29 days.

(21) Appl. No.: 11/725,331

(22) Filed: Mar. 18, 2007

(65) Prior Publication Data

US 2007/0182285 A1 Aug. 9, 2007

Related U.S. Application Data

(63) Continuation-in-part of application No. 10/983,183, filed on Nov. 5, 2004, now Pat. No. 7,247,977.

(60) Provisional application No. 60/783,213, filed on Mar. 17, 2006.

(51) Int. Cl.
H01L 41/08 (2006.01)
(52) U.S. Cl. .................. 310/317; 134/1; 134/1.3; 310/316.01
(58) Field of Classification Search ............... 310/334, 310/316.01, 317; 134/1, 1.3
See application file for complete search history.

(56) References Cited

U.S. PATENT DOCUMENTS

| | | | |
|---|---|---|---|
| 3,371,233 A | 2/1968 | Cook | 310/8.1 |
| 3,575,383 A | 4/1971 | Coleman | 259/72 |
| 4,118,649 A | 10/1978 | Shwartzman et al. | 310/337 |
| 4,233,477 A | 11/1980 | Rice et al. | 179/110 A |
| 4,527,901 A | 7/1985 | Cook | 366/127 |
| 4,736,130 A | 4/1988 | Puskas | 310/316 |
| 4,998,549 A * | 3/1991 | Bran | 134/184 |
| 5,133,376 A | 7/1992 | Samarin et al. | 134/184 |
| 5,247,954 A | 9/1993 | Grant et al. | 134/184 |
| 5,355,048 A | 10/1994 | Estes | 310/334 |
| 5,656,095 A | 8/1997 | Honda et al. | 134/1 |
| 5,834,871 A | 11/1998 | Puskas | 310/316 |
| 5,865,199 A | 2/1999 | Pedziwiatr et al. | 134/184 |
| 5,895,997 A | 4/1999 | Puskas et al. | 310/316 |
| 6,002,195 A * | 12/1999 | Puskas | 310/325 |
| 6,019,852 A | 2/2000 | Pedziwiatr et al. | 134/1 |
| 6,150,753 A | 11/2000 | DeCastro | 310/334 |

(Continued)

FOREIGN PATENT DOCUMENTS

GB 1 488 252 10/1977

(Continued)

OTHER PUBLICATIONS

Fuchs, John F., "Continuing Developments in Ultrasonic Technology", A2C2, vol. 7, No. 9, (Sep. 2004), pp. 13-18.

(Continued)

Primary Examiner—Jaydi SanMartin
(74) Attorney, Agent, or Firm—K&L Gates LLP

(57) ABSTRACT

A megasonic processing apparatus and method has one or more piezoelectric transducers operating in thickness mode at fundamental resonant frequencies of at least 300 KHz. A generator powers the transducers with a variable-frequency driving signal that varies or sweeps throughout a predetermined sweep frequency range. The generator repeatedly varies or sweeps the frequency of the driving signal through a sweep frequency range that includes the resonant frequencies of all the transducers.

9 Claims, 5 Drawing Sheets

U.S. PATENT DOCUMENTS

| | | | |
|---|---|---|---|
| 6,181,051 B1 | 1/2001 | Puskas | 310/316.01 |
| 6,313,565 B1 | 11/2001 | Puskas | 310/316.01 |
| 6,433,460 B1 | 8/2002 | Puskas | 310/317 |
| 6,538,360 B2 | 3/2003 | Puskas | 310/316.01 |
| 6,819,027 B2 | 11/2004 | Saraf | 310/316.01 |
| 6,880,560 B2 * | 4/2005 | Ching et al. | 134/1.3 |
| 7,104,268 B2 | 9/2006 | Wu et al. | 134/3 |
| 2005/0098194 A1 | 5/2005 | Christenson | |

FOREIGN PATENT DOCUMENTS

| | | |
|---|---|---|
| JP | 2-34923 | 5/1990 |
| JP | 9-199464 | 7/1997 |
| JP | 10-52669 A | 2/1998 |
| WO | PCT/US2007/006885 | 3/2007 |

OTHER PUBLICATIONS

Busnaina, Ahmed A., Ph.D., "Ultrasonic and Megasonic Particle Removal", Precision Cleaning '95 Proceedings, pp. 347-359.

Manchester, Russell C., "The Precision Cleaning of Delicate Structures Using Aggressive Ultrasonics Without Damage", Apr. 1997, pp. 13-.

Manchester, Russell C., "The Precision Cleaning of Delicate Structures Using Aggressive Ultrasonics Without Damage", Apr., 1997, pp. 13-19.

* cited by examiner

MEGASONIC PROCESSING APPARATUS WITH FREQUENCY SWEEPING OF THICKNESS MODE TRANSDUCERS

RELATED APPLICATION

This application is a continuation-in-part application of U.S. application Ser. No. 10/983,183, filed Nov. 5, 2004, now U.S. Pat. No. 7,247,977 entitled ULTRASONIC PROCESSING METHOD AND APPARATUS WITH MULTIPLE FREQUENCY TRANSDUCERS, and invented by J. Michael Goodson. This application also claims priority from co-pending U.S. Provisional Application No. 60/783,213, filed Mar. 17, 2006, entitled MEGASONIC PROCESSING APPARATUS WITH FREQUENCY SWEEPING, and invented by J. Michael Goodson. These two prior applications are expressly incorporated herein by reference.

BACKGROUND OF THE INVENTION

1. Field of the Invention

This invention relates generally to megasonic processing apparatus and associated methods involving one or more piezoelectric transducers operating in thickness mode at megasonic frequencies of at least 300 KHz or higher, and relates more particularly to improving performance by sweeping the frequency of a driving signal throughout a predetermined or programmable frequency range that spans the resonant frequencies of all the transducers.

2. Description of the Relevant Art

Megasonic processing involves generating and using high frequency energy at frequencies above 300 KHz. Many megasonic systems operate at frequencies at or near 1,000 KHz, or one megahertz. Although 1 MHz is the consensus, preferred frequency for many applications, the frequency range goes much higher, with frequencies as high as 10 MHz. Typical uses for megasonic systems include cleaning delicate objects, such as semiconductor wafers and disc drive media. Such a megasonic cleaning process involves placing the objects to be cleaned in a fluid-filled tank, and applying vibrational energy at megasonic frequencies to a radiating surface or surfaces of the tank. One or more piezoelectric transducers are used to generate the vibrational energy. A generator supplies an alternating current driving signal at the resonant frequency of the transducers. Megasonic transducers operate in thickness mode, where a piezoelectric element is excited by an alternating current driving signal that causes alternating expansion and contraction of the transducer, primarily expanding and contracting the thickness of the transducer. A piezoelectric transducer having a thickness of 0.080 inches has a fundamental, thickness mode, resonant frequency of 1,000 KHz.

Megasonic processing has some similarities with ultrasonic processing, which involves lower fundamental frequencies, typically from about 25 KHz to about 192 KHz. Ultrasonic transducers are typically mass-balanced, with inert masses on either side of a piezoelectric element, and have a significant radial component of movement at right angles to the thickness component. One common construction of an ultrasonic transducer is to stack several layers of ring-shaped piezoelectric elements between two masses, and to hold the assembly together with an axial compression bolt. Ultrasonic cleaning is based on cavitation, which is the formation and collapse of bubbles in the fluid.

At the frequencies used for megasonic cleaning, significant cavitation does not occur, so the cleaning action is based on another mechanism known as micro-streaming, which is a general flow of detached particles flowing away from the megasonic transducers. This flow consists of planar waves originating at the surface to which the transducers are mounted. The planar nature of these micro-streams affects the distribution of megasonic energy throughout the tank. One way to improve the distribution is to cover a high percentage of the surface area of the tank with transducers. Another but less efficient way is to oscillate or move the parts to be processed throughout the tank so that all surfaces are exposed to sufficiently high megasonic energy.

It is known that radial-mode ultrasonic activity in a cleaning tank may benefit from a process of sweeping or varying the frequency of the driving signal. However, there has been an industry-wide belief that you cannot sweep megasonic frequencies because the sound waves are too small and weak for any benefit from sweeping. In addition, it has been thought that there would be no benefit from sweeping megasonic frequencies because of the thickness mode transducers and resultant planar nature of megasonic vibrations and due to the different cleaning mechanisms at work as compared to ultrasonics.

SUMMARY OF THE INVENTION

The present invention relates to a megasonic processing apparatus and method having one or more piezoelectric transducers (PZT) operating in thickness mode at megasonic frequencies in excess of 300 KHz. A megasonic generator operating at megasonic frequencies drives the transducers with a variable-frequency driving signal that varies or sweeps throughout a predetermined or programmable sweep frequency range. The megasonic generator generates the driving signal at megasonic frequencies to energize the megasonic piezoelectric transducers to cause them to vibrate in thickness mode at their megasonic resonant frequencies. The piezoelectric transducers emit energy at the megasonic frequencies that can be used for various applications, such as cleaning objects in a fluid-filled tank. The generator repeatedly varies or sweeps the frequency of the driving signal through a sweep frequency range that includes the resonant frequencies of all the megasonic piezoelectric transducers.

Another aspect of the present invention involves grouping the megasonic piezoelectric transducers into groups having similar resonant frequencies, and powering each group with a separate frequency-sweeping driving signal from a generator operating within a sweep frequency range that includes the resonant frequencies of the group of associated transducers. This subdivides the overall sweep frequency range into smaller subranges, which may or may not overlap, and reduces the range of each frequency sweep. The effect of grouping transducers is to proportionately increase the amount of time that any particular transducer is operating at or close to its resonant frequency and thereby improve efficiency.

The present invention encompasses a megasonic system that includes one or more piezoelectric transducers and one or more megasonic generators coupled to the transducers for supplying varying-frequency megasonic driving signals at selectable or programmable frequency ranges and sweep rates.

When a megasonic process is used, for example, for cleaning silicon wafers or disc drive media, sweeping the driving signal through the resonant frequencies of all the thickness-mode megasonic transducers will equalize the megasonic energy generated by the transducers and will cause the transducers to perform in unison. This results in a more uniform distribution of megasonic energy and improved performance.

The same improved megasonic energy uniformity and functionality can also be achieved in liquid processing, non-destructive testing, medical imaging, and other processes using megasonic thickness-mode transducers by sweeping the range of resonant frequencies of the transducers. The frequency sweeping process will also extend the life of the megasonic transducers because it is less stressful to the transducers than operating at a single fixed frequency. The frequency sweeping process also improves the uniformity of megasonic energy throughout the tank or other apparatus because each transducer operates at its resonant frequency during at least part of each frequency sweeping cycle. It is expected that any application or process using megasonic frequencies will benefit from the uniform distribution of power created by sweeping the driving signal through all the transducers' resonant frequencies.

A key to optimizing efficiency of a megasonic process is to have uniform energy throughout the radiating surface being excited with megasonics. To do this, preferably 80% or more of the area of the radiating surface is covered by thickness-mode megasonic transducers. Furthermore, each megasonic transducer produces consistent megasonic energy by sweeping the frequency of the driving signal through the highest and lowest resonant frequencies of a group of transducers.

For best performance, each megasonic transducer needs to be energized substantially the same as other megasonic transducers bonded to the same surface. To achieve this, the driving frequency is swept through the resonant frequencies of all the transducers. Sweeping the resonant frequencies of megasonic transducers drives every transducer at its resonant frequency at some point in each cycle. This creates uniformity in transducer performance not previously achieved in the industry.

In addition, frequency sweeping of megasonic transducers reduces a "fountain effect" observed with fixed-frequency megasonic transducers. The fountain effect is thought to be caused by a transducer operating at its resonant frequency with a fixed frequency driving signal, which produces a significant up-surge of liquid in the tank above that transducer. Sweeping the megasonic frequency driving signal ensures that any particular transducer will not be driven continuously at its resonant frequency, thus eliminating the upsurge associated with the fountain effect. Instead, the megasonic energy is uniformly distributed throughout the tank because all transducers are operating efficiently at their resonant frequencies at some point during each sweep cycle.

Frequency sweeping is far more dramatic with megasonic frequencies than ultrasonic frequencies like 40 KHz. Improvements in power distribution of 500 to 700% have been seen with megasonic resonant frequency sweeping and this means substantially better processing.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

DETAILED DESCRIPTION OF THE PREFERRED EMBODIMENTS

Figure 1:
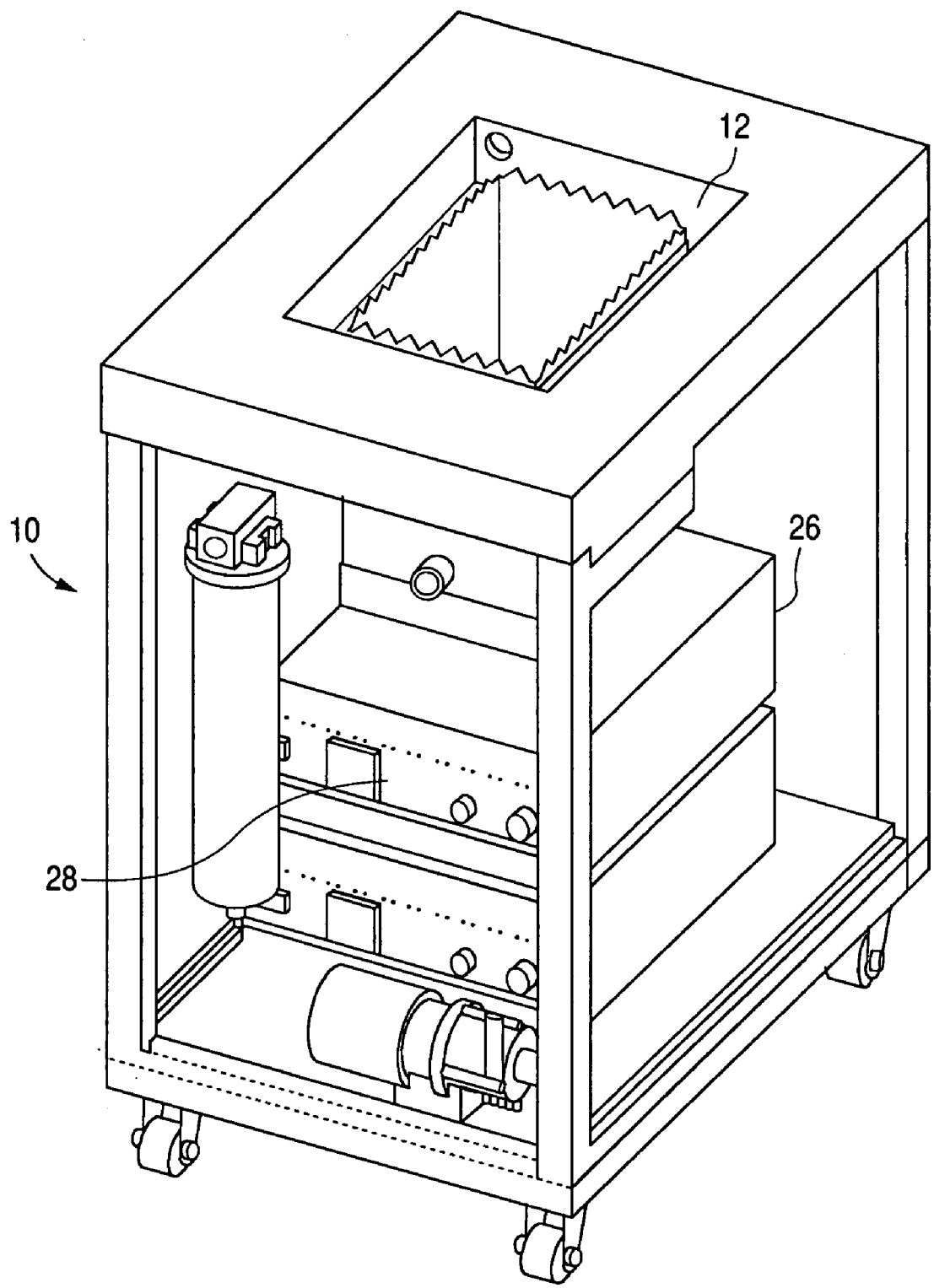
FIG. 1 is an overall perspective view of a megasonic processing system according to the present invention.

The drawings depict various preferred embodiments of the present invention for purposes of illustration only. One skilled in the art will readily recognize from the following discussion that alternative embodiments of the structures and methods illustrated herein may be employed without departing from the principles of the invention described herein.

One aspect of the present invention is a megasonic processing apparatus and method having a megasonic generator with a programmable sweep frequency range and a programmable sweep rate. The sweep frequency range is the range of frequencies or bandwidth within which the megasonic generator outputs a driving signal to drive one or more megasonic thickness-mode piezoelectric transducers at their resonant frequencies. The sweep rate is the number of times the resonant frequencies are swept per second.

The megasonic generator preferably includes a controller or other controlling device with means to allow a user to select or program the sweep frequency range or bandwidth and the sweep rate for the driving signal. The user inputs one or more combinations of sweep frequency range and sweep rate into the memory device of the generator. The generator generates and outputs the driving signal according to the sweep frequency range and sweep rate selected by the user.

When used in a cleaning application, for example, the megasonic piezoelectric transducer or transducers may be mounted on the bottom or sides of a tank, or enclosed in an immersible container within the tank. The sweeping frequency generator may be used to drive megasonic transducers in applications other than cleaning. Preferably, the transducers are piezoelectric crystals or piezoelectric ceramic (also known as PZTs), such as barium titanate or lead zirconate titanate, operating in thickness mode. Using different sweep rates or sweep frequency ranges in the same process may enhance cleaning of some parts because certain frequencies may be more effective than others.

A device that sweeps the frequency of the driving signal is incorporated into the megasonic generator that generates the driving signal. The generator includes a user interface that includes one or more input devices, such as knobs, dials, software, keyboard, graphical user interface, network connection, or other input devices, that permit a user to set a sweep frequency range or bandwidth over which the generator operates and also to set a sweep rate at which the generator sweeps through the programmed range. The controls for user programming the sweep frequency range and sweep rate may be analog or digital.

As shown in FIGS. 1-6, one embodiment of the present invention is a cleaning system 10 that includes a quartz cleaning tank 12 containing a cleaning liquid or solution 14 and one or more pieces 15 to be cleaned. Megasonic energy is supplied to the cleaning liquid 14 by one or more megasonic frequency transducers 16 affixed to the bottom of the tank 12. Alternatively, megasonic transducers could be affixed to one or more sides of the tank or immersed in the tank. Preferably, the megasonic transducer 16 has a piezoelectric element (PZT) 18 adhesively bonded or otherwise attached to one side of a silicon carbide plate 20. The other side of the silicon carbide plate 20 is adhesively bonded or otherwise attached to the outside bottom surface of the cleaning tank 12. Preferably, bonding layers 22 between the silicon carbide plate 20 and the tank 12 and between the silicon carbide plate and the piezoelectric element 18 are composed of perforated copper foil and an impedance matching adhesive. Alternatively, the bonding layers may be composed of epoxy or other adhesive used for die bonding semiconductor chips to package substrates.

The piezoelectric element can be square, rectangular, or a circular disk, or other shape having uniform thickness. For example, for operation at a nominal frequency of 1,000 KHz, the piezoelectric element 18 would have a thickness of about 0.08 inches, the silicon carbide plate 20 would have a thickness of about 0.19 inches, and the bottom of the quartz tank 12 would have a thickness of about 0.20 inches. Transducer 16 and cleaning system 10 is just one example of a transducer and apparatus that incorporates the present invention.

As shown in FIGS. 3-6, the transducers 16 are preferably rectangular in shape and are arranged parallel to each other. Preferably, the transducers 16 cover a substantial portion of the bottom surface of the tank 12, preferably at least 80%. It is desirable to generate megasonic energy and transfer it to the tank 12 and fluid 14 uniformly throughout the entire area of the surface to which the transducers 16 are attached. Covering a high percentage of the surface area of the tank bottom with transducers ensures that the megasonic energy transferred to the fluid 14 is relatively uniform.

Figure 6:
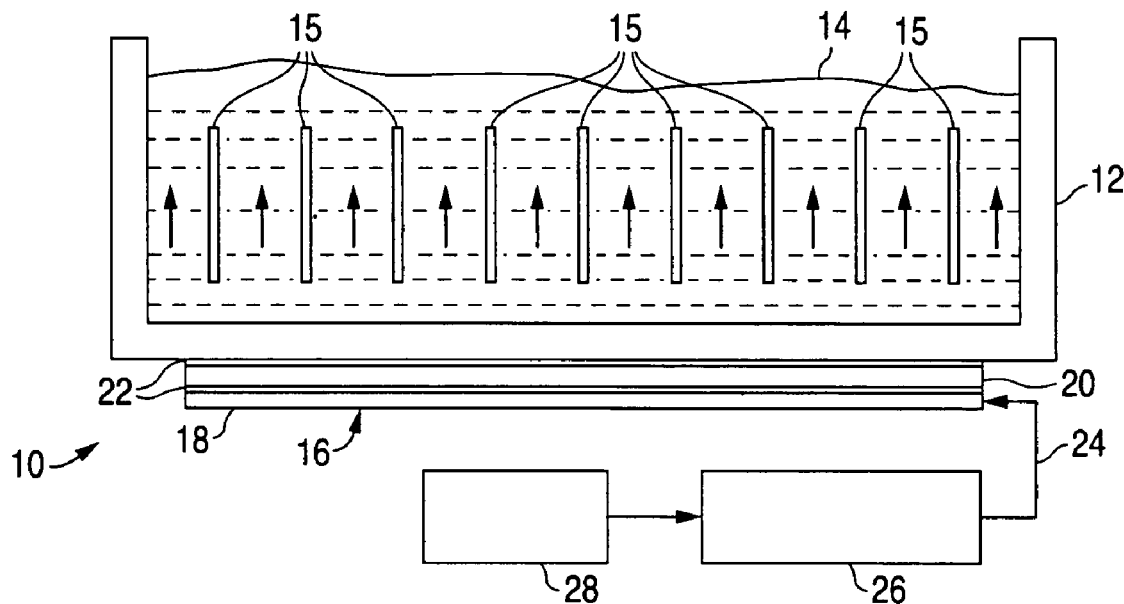
FIG. 6 is a schematic view of the megasonic processing system and a sectional view of the tank and an attached megasonic transducer with a generator that supplies driving signals to the transducer for creating megasonic vibrations in liquid in the tank.

As shown in FIG. 6, the transducers 16 are driven by a driving signal supplied over electrical wires 24 by a programmable generator 26. The generator 26 is programmed by a user through a user input or interface 28 to set the sweep frequency range or bandwidth and the sweep rate of the driving signal output by the generator.

Figure 2:
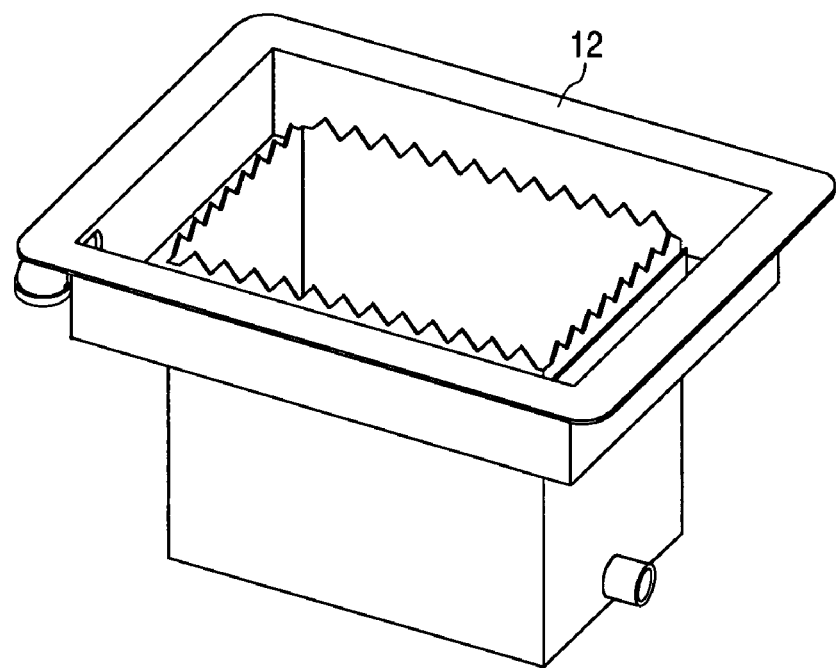
FIG. 2 is a top perspective view of a tank used in the megasonic processing system of the present invention.
Figure 3:
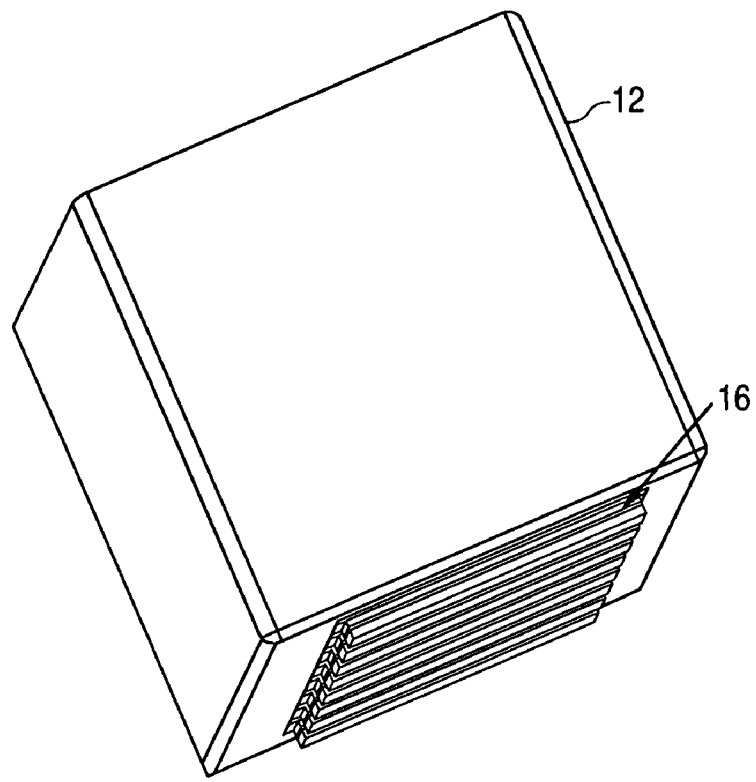
FIG. 3 is a bottom perspective view of the tank.

A megasonic frequency piezoelectric transducer operates in thickness mode such that applied voltages cause the transducer to expand and contract in thickness. These expansions and contractions are transmitted through the silicon carbide resonator 20 and tank 12 to the fluid 14 and objects 15 in the tank. As shown in FIG. 6, these megasonic-frequency vibrations are primarily horizontal waves 17, provided that the transducers 16 are on the bottom of the tank 12. The waves propagate upwards and convey particles cleaned or separated from the objects 15 in the tank. This is a processed known as micro-streaming, in which there is a net movement upward, away from the source of megasonic energy. As shown in FIGS. 1 and 2, the tank has a weir 21 over which excess fluid and particles flow, and a pump 23 and filter 25 to recirculate and clean the fluid.

Resonant frequency is generally the frequency where the mechanical and electrical properties of a transducer can most efficiently transmit sound waves. In megasonic transducers operating in thickness mode, the thickness of the transducer determines the resonant frequency. For example, a transducer that is 0.08 inches thick will have a resonant frequency of about 1,000 KHz. A transducer that is 0.065 inches thick will have a resonant frequency of about 1230 KHz. A transducer that is 0.050 inches thick will have a resonant frequency of about 1600 KHz. The term "resonant frequency" is used herein to mean the lowest, fundamental frequency where the transducer as installed has a natural resonance.

As stated above, a piezoelectric transducer having a thickness of 0.080 inches has a fundamental resonant frequency of 1,000 KHz. A tolerance on the thickness of such a transducer has a significant effect on the resonant frequency. A thickness variation of 0.001 inch would cause a resonant frequency variance of 12.5 KHz. Also, the two major surfaces of the transducer should be flat and co-planar, but any variances can also affect the resonant frequency. Even though it is desirable from a performance standpoint for all transducers to have exactly the same resonant frequency, from a manufacturing tolerance standpoint, it is impractical. However, the frequency sweeping of the present invention overcomes this obstacle.

One advantage of the present invention is that sweeping the frequency of the driving signal through the resonant frequencies of all the transducers distributes the sound waves equally among the transducers. This makes it possible to have substantially equal megasonic energy throughout the tank. This is important because the thickness-mode transducers produce sound waves that travel vertically from the bottom to the top of the tank with little spreading in lateral directions. The even distribution of megasonic energy can best be achieved by sweeping just outside the highest and lowest resonant frequencies of the transducers.

Another advantage of the present invention is that it accommodates tolerances in the resonant frequencies of the transducers. Performance is best if variances of the resonant frequency are minimized. Choosing transducers with exactly the same resonant frequency will help minimize variances (although at increased cost), but even then there will be some variances from the adhesives or other binder materials used to mount the transducers because any variation in thickness creates a variation in frequency with thickness mode applications. Sweeping the frequency of the driving signal according to the present invention accommodates such inevitable variations.

Still another advantage of the present invention is that it reduces surges of fluid in the tank. Without sweeping the driving signal, the transducers at or closest to the frequency of the driving signal tend to create a powerful upward force that pushes the fluid upward, sometimes as much as two inches above the surface level. Such surface surges are a problem because they cause air to be incorporated into the fluid as it is recirculated, which can interfere with the megasonic process. Surges are also a problem because if the liquid is solvent it will evaporate in the air and can be harmful to the operator and or the people in the area, especially if the fluid is an acid or other hazardous material. Sweeping the driving signal with the present invention reduces these problems.

Figure 7:
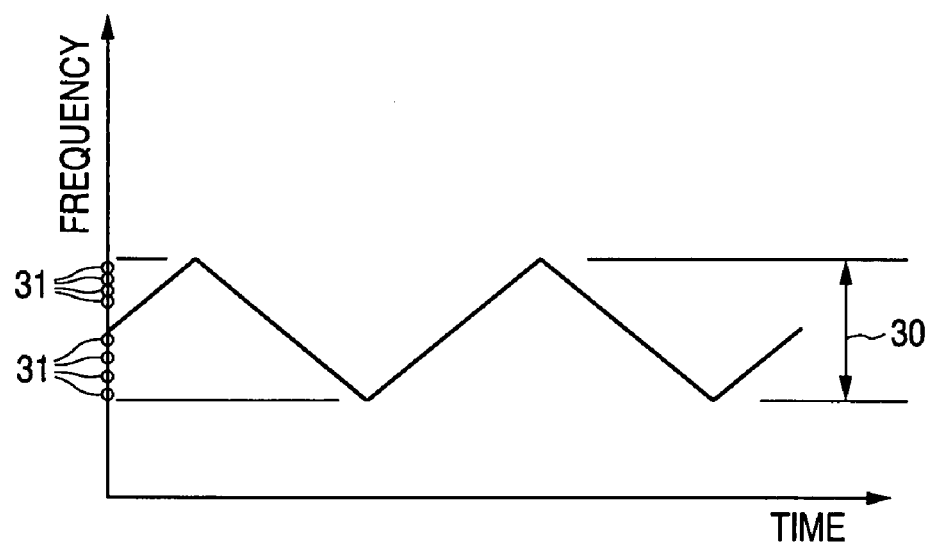
FIG. 7 is a graph of frequency versus time of a driving signal used in one embodiment of the present invention.

As shown in FIG. 7, the generator 26 varies the frequency of the driving signal as a function of time. For example, the frequency of the driving signal may vary linearly in a sawtooth pattern over a programmed sweep frequency range 30 that includes the resonant frequencies 31 of all the megasonic transducers 16. The sweep frequency range or bandwidth of the generator is programmed by a user and stored in a memory device associated with the generator 26. The rate at which the frequency varies is determined by the sweep rate programmed by the user and stored in the memory device of the generator. The generator can be programmed to vary the frequencies of the driving signal according to other functions or programs and need not be limited to linear functions that form a triangular wave or saw tooth pattern as shown in FIG. 7. The variation in frequency can be, for example, sinusoidal, exponential, and other functions. The driving signal itself may be sinusoidal, square, triangular, or other wave shape. The sweep rates need not be the same for sweeping upwards (increasing frequency) and downwards (decreasing frequency). Preferably, the user can also set the number of periods and can establish rest times when the generator shuts off the driving signal.

In a cleaning application, some parts may be best cleaned by a single transducer instead of multiple transducers. In such a configuration, the performance of the transducer can be enhanced by using a programmed software program that identifies the optimum resonant frequency and sweeps through this frequency within a defined range. For best results, the driving frequency can be swept through a sweep range of 1% or less to ensure that the resonant frequency of the transducer is being excited repeatedly. A benefit of the present invention is that it reduces the adverse effects of resonant frequency drifting because the resonant frequency of each transducer is being excited each cycle even if it changes with time, provided that the sweep range or bandwidth is wide enough.

Commonly, multiple megasonic transducers 16 are used for a given task or process, in which case it is common to drive all transducers with the same generator and driving signal. Where multiple transducers are used, however, there may not be a single optimum frequency due to performance variations and manufacturing tolerances among the transducers. Production tolerances result in megasonic transducers having resonant frequencies within a 3% to 4% range. For example, at 1000 KHz, a 4% range would be plus or minus 20 KHz from the nominal 1000 KHz, or a range of 980 to 1020 KHz.

In such applications, according to the present invention, it is appropriate to repeatedly sweep the frequency of the driving signal to ensure that at least some of the time the transducer 16 is operating at or near its resonant frequency. In order to have each transducer 16 operate at or near its resonant frequency, the generator sweeps through a predetermined sweep frequency range that is designed to reach the lowest and highest resonant frequencies 31 of the group of transducers. The sweeping frequency function of the generator 26 covers that range of variance. The frequency sweeping function can be fixed or it can be programmed to be variable as to speed (sweeps per second) or range (minimum and maximum frequencies).

Another aspect of the present invention relates to grouping the megasonic piezoelectric transducers into multiple groups according to their resonant frequencies, and driving each group with a separate variable-frequency driving signal. Transducers with similar resonant frequencies are grouped together to reduce the range of frequencies through which the generator must sweep in order to operate the group of transducers at or near their resonant frequencies. Reducing the frequency range of the sweep increases the time that each transducer operates at or near its resonant frequency.

As the range of sweep frequency coverage is reduced, the rate of sweep can be increased to create more activity if required by a particular application, or if the sweep rate remains the same, then the repetition rate is increased. The result is that the megasonic transmission at each transducer's resonant frequency will be greater since the sweep covers a shorter span and the transducer operates for a greater percentage of time at or near its resonant frequency, which increases the efficiency of the megasonic process.

Figure 8:
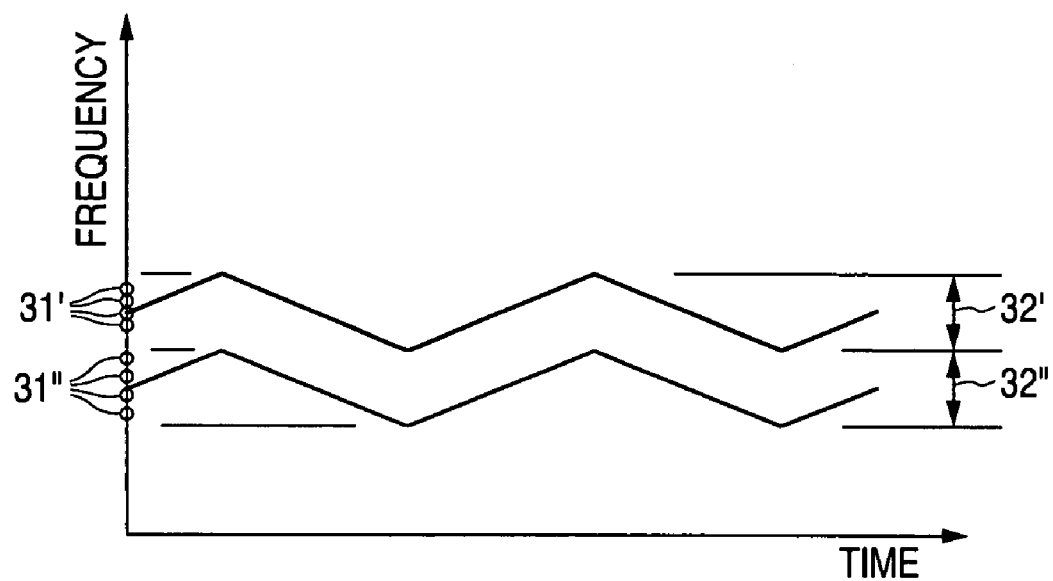
FIG. 8 is a graph of frequency versus time of two driving signals used in another embodiment of the present invention in which the sweep period is the same as in FIG. 7.
Figure 9:
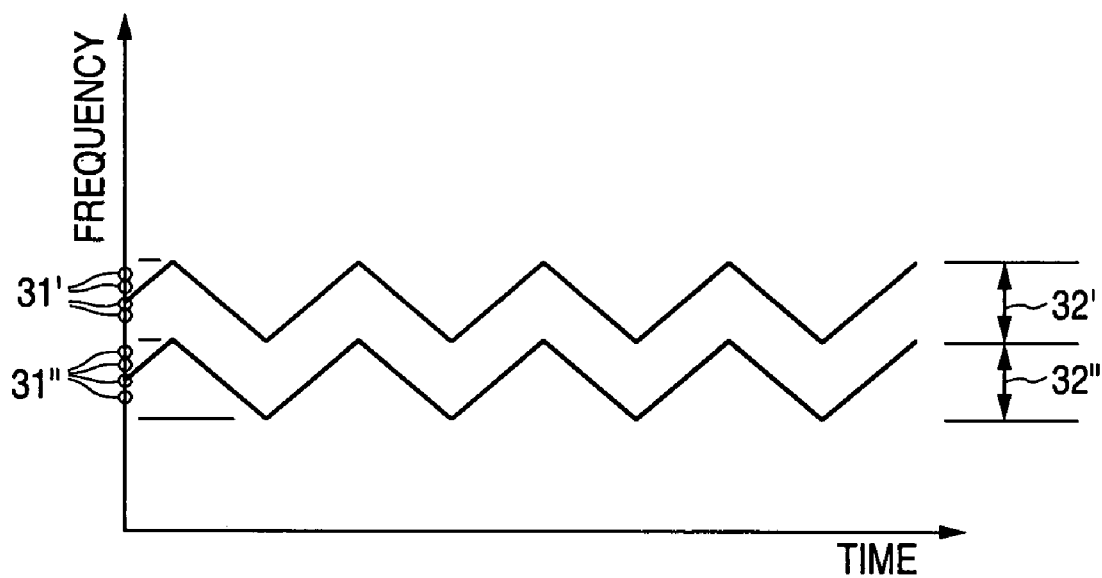
FIG. 9 is a graph of frequency versus time of two driving signals used in another embodiment of the present invention in which the sweep rate is the same as in FIG. 7.

This point is illustrated in FIGS. 7, 8, and 9. In FIG. 7, a single generator sweeps the driving signal between minimum and maximum frequencies over a range 30. In FIG. 8, two generators are used to cover the same overall range, but each generator covers a subrange 32 that is one-half of the full range 30. Half of the transducers have resonant frequencies 31' in the upper subrange 32', and the other half of the transducers have resonant frequencies 31" in the lower subrange 32". The number of sweeps per unit time is the same in FIGS. 7 and 8. In FIG. 9, the rate of change of the sweeping frequency is the same as in FIG. 7, but the range is cut in half so that twice as many sweeps occur in the same period of time.

As an example of grouping, assume that twelve megasonic transducers are used in a process having the following nominal resonant frequencies (in KHz):

| 1010 | 1030 | 1015 | 1007 |
|------|------|------|------|
| 1019 | 1004 | 1027 | 1038 |
| 1022 | 1014 | 1031 | 1040 |

These frequencies range from a minimum of 1004 KHz to a maximum of 1040 KHz, for a total range of 36 KHz (±18 KHz) centered at 1022 KHz. Sweeping the frequency of the driving signal to include the resonant frequencies of all twelve transducers would require a total sweep of 36 KHz.

These twelve transducers could be divided into two groups, A and B, to reduce the sweep range:

| Generator A | | Generator B | |
|---|---|---|---|
| 1004 | 1014 | 1022 | 1031 |
| 1007 | 1015 | 1027 | 1038 |
| 1010 | 1019 | 1030 | 1040 |

The transducers driven by Generator A range from 1004 KHz to 1019 KHz, for a total range of 15 KHz (±7.5 KHz) centered at 1011.5 KHz. The transducers driven by Generator B range from 1022 KHz to 1040, for a total range of 18 KHz (±9 KHz) centered at 1031 KHz. By grouping the transducers according to their resonant frequencies and reducing the sweep range for each sweeping generator, the number of sweeps per unit time can be increased or the sweep rate can be decreased, either of which allows the transducers to be driven at or near their resonant frequencies more often, which enhances the megasonic process.

In actual practice, the sweep frequency ranges are set slightly outside the maximum and minimum resonant frequencies for the associated transducers. So, in the example above, the sweep frequency range of Generator A might be set to 1003 to 1020 KHz or 1002 to 1021 KHz and the sweep frequency range of Generator B might be set to 1021 to 1041 KHz or 1020 to 1042 KHz. This ensures that each transducer operates both below and above its resonant frequency in each frequency sweep cycle and also allows for shifts of the resonant frequencies that may occur due to heating or other variables.

Transducers can be grouped within an individual system or process or among multiple systems or processes operating simultaneously. For example if there are two tanks with multiple transducers each and both tanks will be used simultaneously, one can group transducers from the larger universe of all transducers on the two tanks. Groupings may be further selected to produce a more uniform result as the transducers powered by a single generator do not have to be next to each other or used with the same tank to be in the group. Because all transducers work simultaneously, the designer of the transducer layout can focus on maximizing the efficiency of the grouping without regard to where the members of the groups are located.

As an example of grouping among multiple, simultaneous processes, assume that the same twelve megasonic transducers set forth in the previous example are located on two different tanks:

| Tank 1 | | Tank 2 | |
|---|---|---|---|
| 1010 | 1030 | 1015 | 1007 |
| 1019 | 1004 | 1027 | 1038 |
| 1022 | 1014 | 1031 | 1040 |

The twelve transducers of Tanks 1 and 2 are divided into two groups according to resonant frequencies and are driven by Generators A and B as follows (with the tank number shown in parentheses):

| Generator A | | Generator B | |
|---|---|---|---|
| 1004 (1) | 1014 (1) | 1022 (1) | 1031 (2) |
| 1007 (2) | 1015 (2) | 1027 (2) | 1038 (2) |
| 1010 (1) | 1019 (1) | 1030 (1) | 1040 (2) |

Generator A drives four transducers of Tank 1 and two transducers of Tank 2. Generator B drives two transducers of Tank 1 and four transducers of Tank 2. Since all transducers are operating at the same time, this grouping allows the two generators to sweep across smaller ranges.

Thus, in cleaning and other processes where multiple tanks or systems are used, the entire population of transducers in multiple tanks or systems can be combined to create an optimum assortment of frequencies to be grouped together, with each group powered by a different sweeping generator. For example in four processes using four tanks, transducers from any or all of the four tanks may be networked together to achieve the optimum range of frequencies for sweeping. Of course, all processes must be active at the same time for such grouping.

Figure 4:
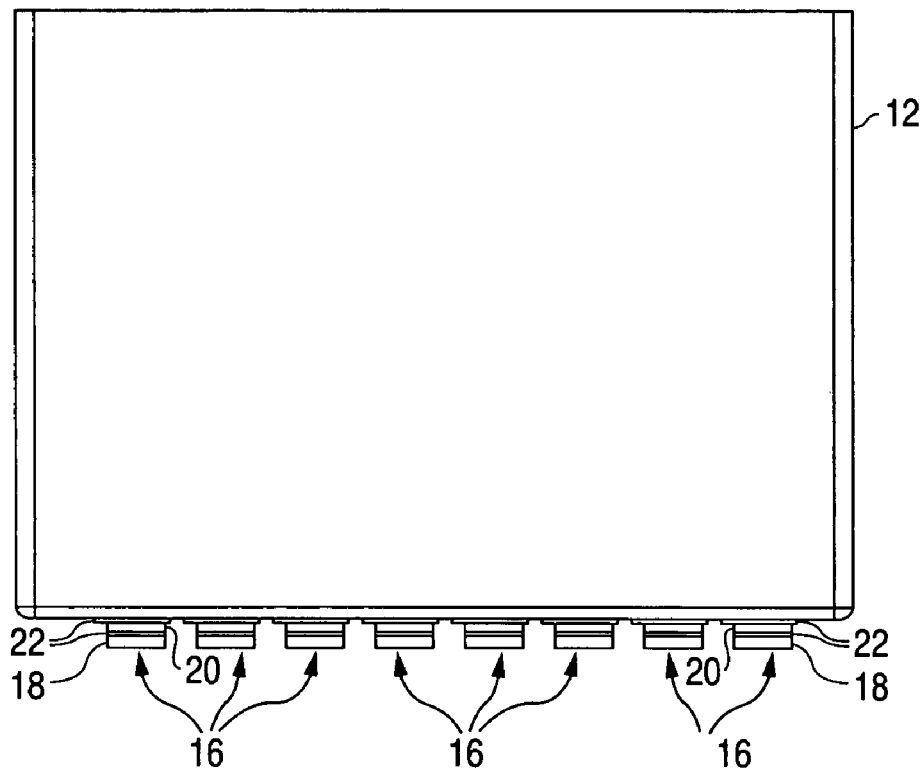
FIG. 4 is a side elevation view of the tank.
Figure 5:
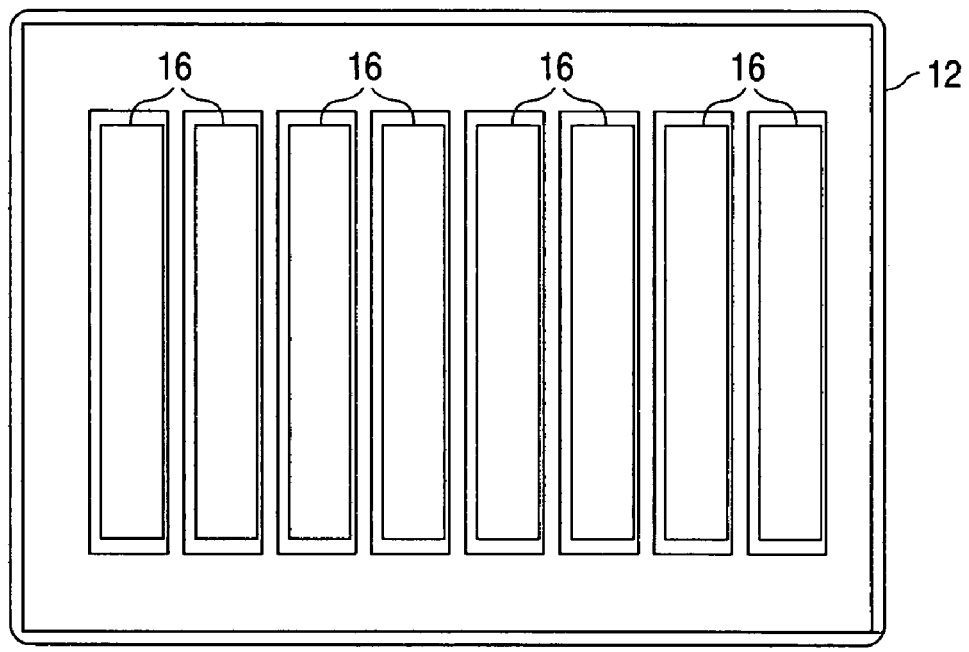
FIG. 5 is a bottom view of the tank.

Another aspect of the present invention is the construction of the megasonic transducer 16 and its attachment to another structure, such as the bottom of tank 12, using a perforated metal layer and impedance matching adhesive. As shown in FIGS. 4 and 6, the megasonic transducer 16 preferably has a silicon carbide plate 20 between the piezoelectric element 18 and the surface of the cleaning tank 12 or other structure to which the transducer is attached. The piezoelectric element 18 is bonded to the silicon carbide plate 20, and the assembly is bonded to the tank 12 with bonding layers composed of a perforated metal foil, preferably copper, and an adhesive.

The perforated copper (or other metal) foil improves flatness and uniformity of thickness of the bonding layer 22. The perforated copper has a predetermined thickness that allows the adhesive to be evenly distributed, thus avoiding irregularities or non-uniformity of adhesive thickness without using a jig or other stabilizing device. The perforated metal provides a controllable flat structure to maintain uniformity in thickness of the adhesive. The perforated metal also serves as an electrode between the piezoelectric element and the silicon carbide plate.

The application of the present invention is not limited to cleaning operations. The same principle of sweeping the acoustical energy for megasonic transducers can be applied to other uses of micro-streaming of megasonic energy, such as non destructive testing, or any other applications using thickness mode transducers having fundamental resonant frequencies of at least 300 KHz. Sweeping megasonic transducers creates greater energy bursts, which create improved and stronger micro-streaming activity which improves the efficiency of micro-streaming cleaning and other uses of micro-streaming. Micro-streaming is a flow of energized liquid created by the release of ultrasonic energy that is too weak to cause cavitation. At frequencies in excess of 300 KHz, cavitations cease to exist but the megasonic frequency energy creates a flow of the liquid.

From the above description, it will be apparent that the invention disclosed herein provides a novel and advantageous megasonic processing apparatus and method utilizing a variable frequency driving signal. The foregoing discussion discloses and describes merely exemplary methods and embodiments of the present invention. As will be understood by those familiar with the art, the invention may be embodied in various other forms without departing from the spirit or essential characteristics thereof. Accordingly, the disclosure of the present invention is intended to be illustrative, but not limiting, of the scope of the invention, which is set forth in the following claims.

What is claimed is:

1. A megasonic processing apparatus comprising:
    one or more unclamped piezoelectric transducers, each having a fundamental resonant frequency in thickness mode vibration of at least 300 KHz;
    an unpressurized tank adapted to contain liquid and one or more parts to be processed, wherein said one or more transducers provide megasonic vibrations to the contents of the tank; and
    a generator coupled to the transducers for supplying a driving signal at a variable frequency throughout a frequency range that includes the fundamental resonant frequencies of all the transducers.

2. An apparatus as recited in claim 1 wherein the generator has an adjustable sweep rate and an adjustable frequency range.

3. An apparatus as recited in claim 2 wherein the sweep rate is in the range of 50 to 1200 sweeps per second.

4. An apparatus as recited in claim 1 wherein the apparatus has at least four transducers and two generators, wherein the transducers are grouped by similar resonant frequencies, and wherein each group of transducers is powered by a separate generator that generates a driving signal having a variable frequency that varies within a frequency range that includes the resonant frequencies of all the transducers of its associated group.

5. An apparatus as recited in claim 1, wherein the one or more transducers are affixed to a surface of the tank.

6. A megasonic processing system comprising:
    two or more unpressurized tanks, each tank adapted to contain liquid and one or more parts to be processed;
    one or more unclamped piezoelectric transducers associated with each tank, each transducer having a fundamental resonant frequency in thickness mode of at least 300 KHz; wherein the transducers provide megasonic vibrations to the fluid and contents of the tank; and two or more generators coupled to the transducers for supplying driving signals to the transducers, wherein the transducers are grouped by similar fundamental resonant frequencies, and wherein each group of transducers is powered by a separate generator that generates a driving signal having a variable frequency tat varies within a frequency range that includes the fundamental resonant frequencies of all the transducers of its associated group.

7. A megasonic cleaning apparatus comprising:

one or more piezoelectric transducers, each having a fundamental resonant frequency in thickness mode vibration at a frequency of at least 300 KHz;

an unpressurized tank adapted to contain liquid cleaning fluid and one or more parts to be cleaned, said one or more transducers provide megasonic vibrations to the cleaning fluid and parts in the tank; and a generator coupled to said one or more transducers for supplying a driving signal at a predetermined frequency range and sweep rate, wherein the frequency range includes the fundamental resonant frequency of all said one or more transducers, and wherein the generator includes programmable means for defining a sweep frequency range and a sweep rate for the driving signal.

8. A megasonic processing method comprising:

providing one or more unclamped piezoelectric transducers, each having a fundamental resonant frequency in thickness mode vibration of at least 300 KHz;

providing an unpressurized tank adapted to contain liquid and one or more parts to be processed, wherein said one or more transducers provide megasonic vibrations to the contents of the tank; and generating and supplying a driving signal to the transducers, wherein the driving signal has a variable frequency throughout a frequency range that includes the fundamental resonant frequencies of all the transducers.

9. A megasonic processing apparatus comprising:

one or more unclamped piezoelectric transducers, each having a fundamental resonant frequency in thickness mode vibration of at least 300 KHz; and a generator coupled to the transducers for supplying a driving signal at a variable frequency throughout a frequency range that includes the fundamental resonant frequencies of the transducers.

* * * * *

UNITED STATES PATENT AND TRADEMARK OFFICE
CERTIFICATE OF CORRECTION

PATENT NO.         : 7,598,654 B2                                    Page 1 of 1
APPLICATION NO. : 11/725331
DATED              : October 6, 2009
INVENTOR(S)        : J. Michael Goodson It is certified that error appears in the above-identified patent and that said Letters Patent is hereby corrected as shown below:

Column 10, in claim 1, line 42 should read:
    -- quency range that includes and exceeds the fundamental resonant --

Column 11, in claim 6, line 6 should read:
    -- ing signal having a variable frequency that varies within a --

Column 11, in claim 6, line 7 should read:
    -- frequency range that includes and exceeds the fundamental resonant" --

Column 11, in claim 7, line 20 should read:
    -- includes and exceeds the fundamental resonant frequency of all said --

Column 12, in claim 8, line 11 should read:
    -- throughout a frequency range that includes and exceeds the funda- --

Column 12, in claim 9, line 19 should read:
    -- quency range that includes and exceeds the fundamental resonant --

Signed and Sealed this

Twenty-fourth Day of August, 2010

David J. Kappos
*Director of the United States Patent and Trademark Office*

(12) INTER PARTES REEXAMINATION CERTIFICATE (508th)
United States Patent
Goodson

(10) Number: US 7,598,654 C1
(45) Certificate Issued: Jan. 9, 2013

(54) MEGASONIC PROCESSING APPARATUS WITH FREQUENCY SWEEPING OF THICKNESS MODE TRANSDUCERS

(75) Inventor: J. Michael Goodson, Skillman, NJ (US)

(73) Assignee: Megasonic Sweeping Incorporated, Trenton, NJ (US)

Reexamination Request:
No. 95/001,317, Mar. 4, 2010

Reexamination Certificate for:
Patent No.: 7,598,654
Issued: Oct. 6, 2009
Appl. No.: 11/725,331
Filed: Mar. 18, 2007

Certificate of Correction issued Aug. 24, 2010.

Related U.S. Application Data

(63) Continuation-in-part of application No. 10/983,183, filed on Nov. 5, 2004, now Pat. No. 7,247,977.

(60) Provisional application No. 60/783,213, filed on Mar. 17, 2006.

(51) Int. Cl.
*H01L 41/08* (2006.01)

(52) U.S. Cl. .......... 310/317; 134/1; 134/1.3; 310/316.01

(58) Field of Classification Search ........................ None
See application file for complete search history.

(56) References Cited

To view the complete listing of prior art documents cited during the proceeding for Reexamination Control Number 95/001,317, please refer to the USPTO's public Patent Application Information Retrieval (PAIR) system under the Display References tab.

*Primary Examiner* — Joseph A. Kaufman

(57) ABSTRACT

A megasonic processing apparatus and method has one or more piezoelectric transducers operating in thickness mode at fundamental resonant frequencies of at least 300 KHz. A generator powers the transducers with a variable-frequency driving signal that varies or sweeps throughout a predetermined sweep frequency range. The generator repeatedly varies or sweeps the frequency of the driving signal through a sweep frequency range that includes the resonant frequencies of all the transducers.

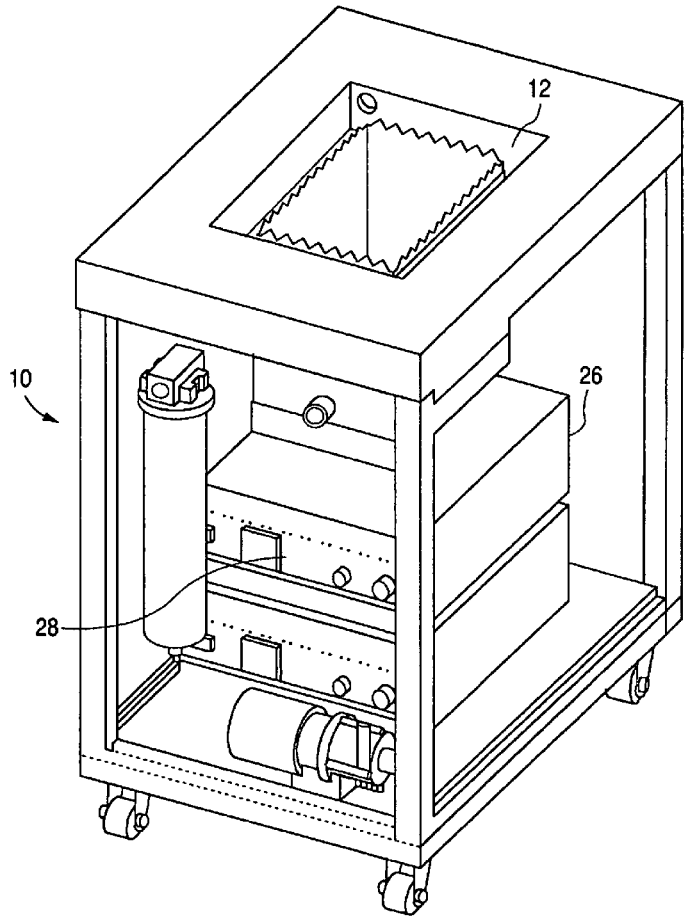

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 1-9 are cancelled.

* * * * *